(12) United States Patent
Nakamura et al.

(10) Patent No.: US 11,018,044 B2
(45) Date of Patent: May 25, 2021

(54) WAFER EXPANDING METHOD AND WAFER EXPANDING APPARATUS

(71) Applicant: DISCO CORPORATION, Tokyo (JP)

(72) Inventors: Masaru Nakamura, Tokyo (JP); Saki Kozuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 115 days.

(21) Appl. No.: 16/664,310

(22) Filed: Oct. 25, 2019

(65) Prior Publication Data

US 2020/0135532 A1    Apr. 30, 2020

(30) Foreign Application Priority Data

Oct. 30, 2018 (JP) .............................. JP2018-203830

(51) Int. Cl.
*H01L 21/683* (2006.01)
*B65G 47/88* (2006.01)
*H01L 21/78* (2006.01)

(52) U.S. Cl.
CPC .......... *H01L 21/6836* (2013.01); *B65G 47/88* (2013.01); *H01L 21/78* (2013.01)

(58) Field of Classification Search
CPC ............. H01L 21/6836; H01L 21/6835; H01L 2221/68336; H01L 2221/68318; H01L 2221/68322; H01L 21/78
See application file for complete search history.

(56) References Cited

U.S. PATENT DOCUMENTS

| | | | |
|---|---|---|---|
| 7,563,642 B2* | 7/2009 | Higashino | H01L 21/67132 438/113 |
| 9,123,794 B2* | 9/2015 | Amano | H01L 21/67132 |
| 9,543,206 B2* | 1/2017 | Yano | H01L 21/68721 |
| 10,242,913 B2* | 3/2019 | Priewasser | H01L 21/6836 |
| 10,615,075 B2* | 4/2020 | Cayabyab | H01L 21/78 |
| 2014/0295643 A1* | 10/2014 | Nakamura | B23K 26/032 438/462 |
| 2014/0339673 A1* | 11/2014 | Shoichi | H01L 21/78 257/499 |
| 2015/0348821 A1* | 12/2015 | Iwanaga | H01L 24/27 257/798 |
| 2017/0213765 A1* | 7/2017 | Furutani | B23K 26/53 |

FOREIGN PATENT DOCUMENTS

JP        2002334852 A    11/2002

* cited by examiner

*Primary Examiner* — Bac H Au

(74) *Attorney, Agent, or Firm* — Greer Burns & Crain Ltd.

(57) ABSTRACT

A wafer expanding method increases spacing between adjacent devices formed on a wafer. The method includes preparing an annular jig having a first restricting portion, a second restricting portion, and a curved restricting portion connecting the first restricting portion and the second restricting portion, mounting a ring frame supporting the wafer through an adhesive tape on a cylindrical frame fixing member, next mounting the annular jig on the ring frame, and next fixing the ring frame and the annular jig to the cylindrical frame fixing member, and operating a cylindrical pushing member having an outer circumference corresponding to an outer circumference of the wafer to push up an annular exposed portion of the adhesive tape defined between the wafer and the ring frame and thereby lift the wafer away from the ring frame, thereby expanding the annular exposed portion and increasing the spacing between the adjacent devices.

2 Claims, 6 Drawing Sheets

FIG.2
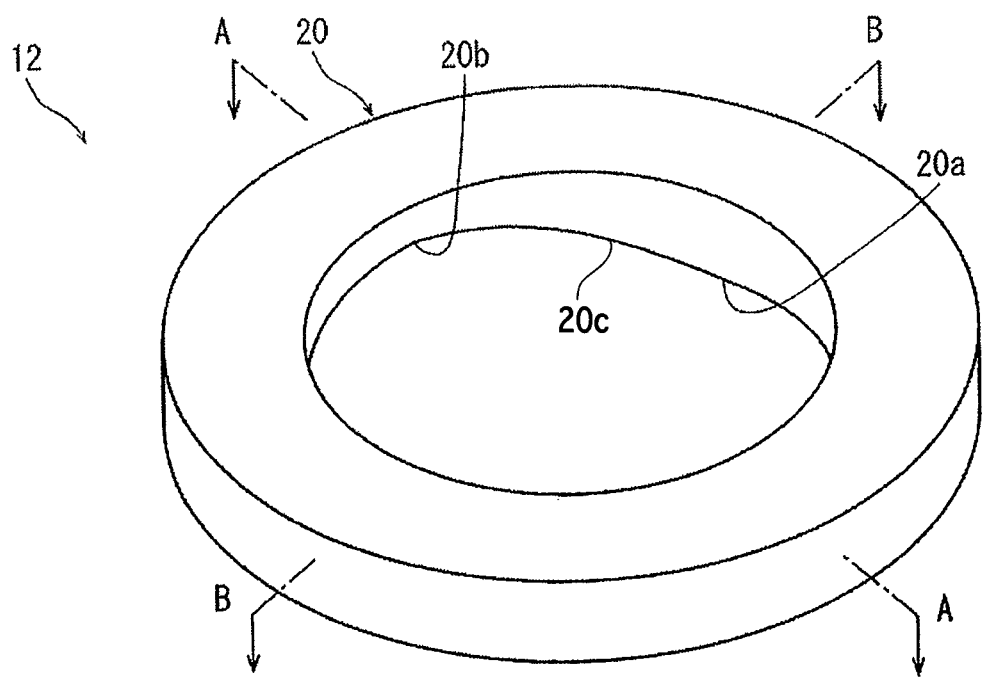
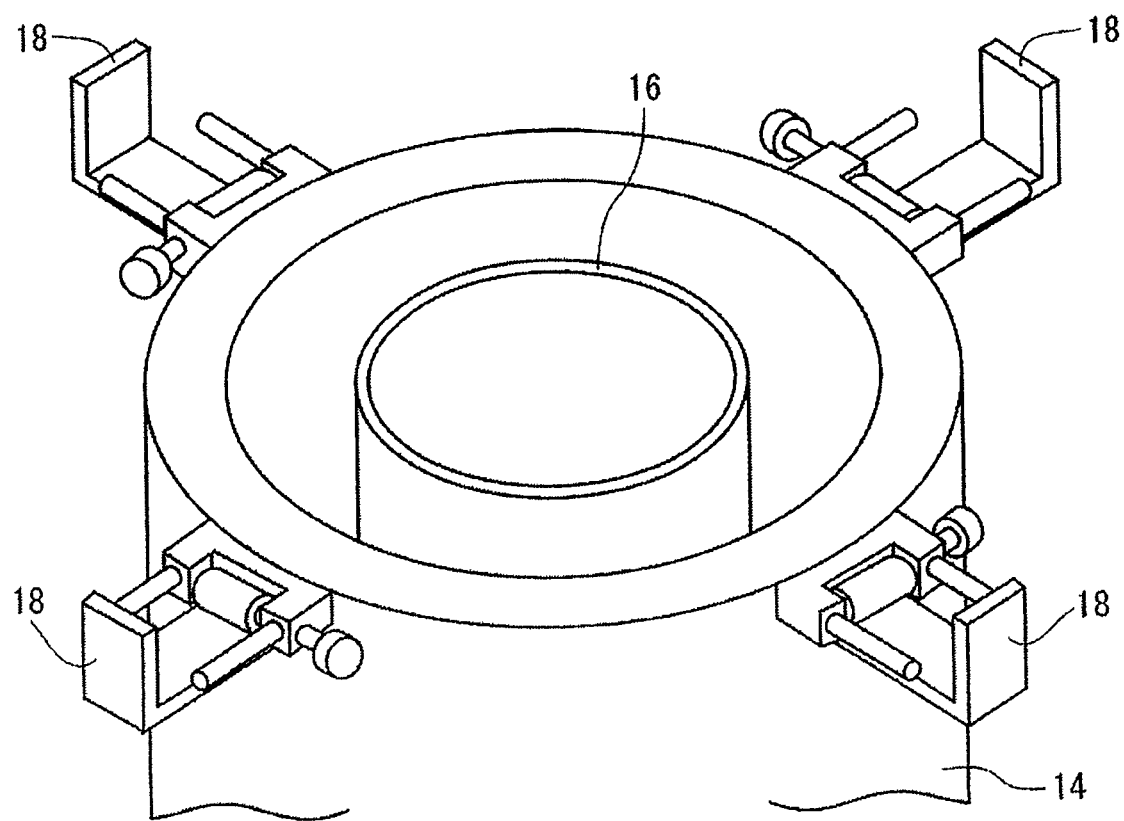

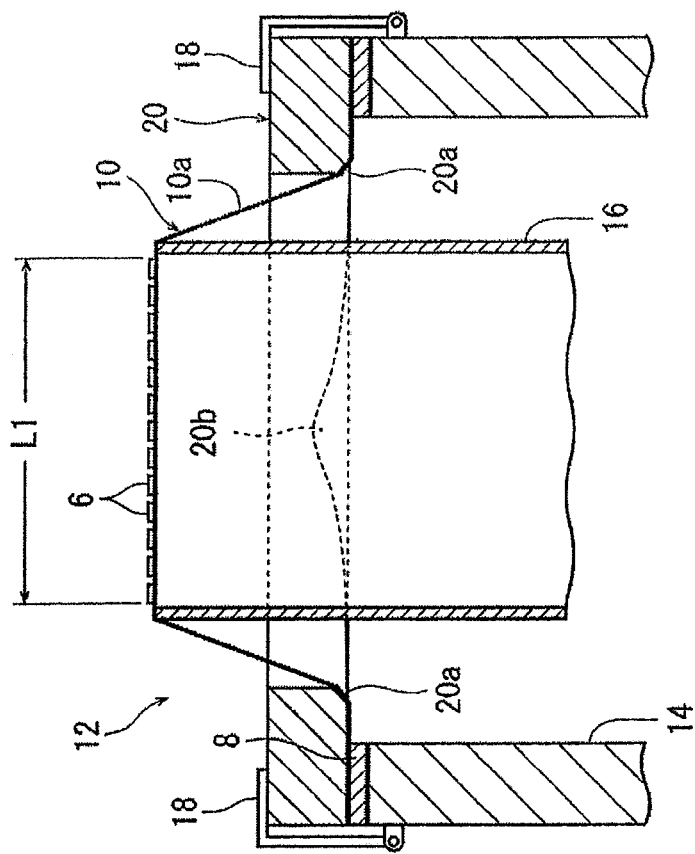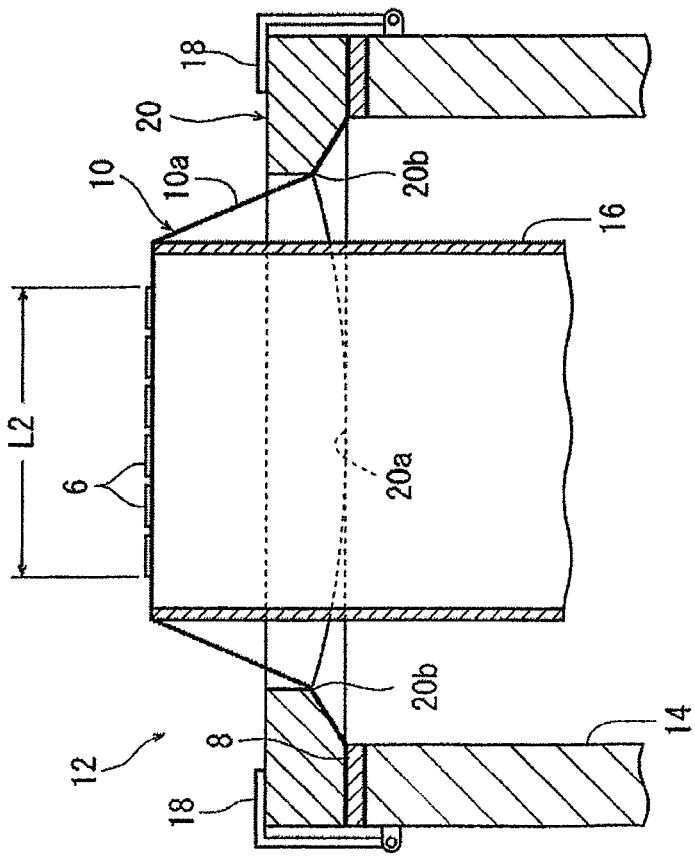

WAFER EXPANDING METHOD AND WAFER EXPANDING APPARATUS

BACKGROUND OF THE INVENTION

Field of the Invention

The present invention relates to a wafer expanding method and apparatus for expanding a wafer having a plurality of rectangular devices respectively formed in a plurality of separate regions defined by a plurality of division lines, thereby increasing the spacing between any adjacent ones of the devices.

Description of the Related Art

A plurality of devices such as integrated circuits (ICs) and large scale integrations (LSIs) are formed on the front side of a wafer so as to be separated from each other by a plurality of division lines. The wafer thus having the plural devices on the front side is divided along the division lines by using a dicing apparatus or a laser processing apparatus to obtain a plurality of individual device chips. The device chips thus obtained from the wafer are used in various electrical equipment such as mobile phones and personal computers.

In dividing the wafer, the wafer is supported through an adhesive tape to a ring frame. The wafer attached to the adhesive tape is divided into the individual device chips, and the adhesive tape is expanded by an expanding apparatus to increase the spacing between any adjacent ones of the individual device chips attached to the adhesive tape, thereby facilitating a pickup operation for picking up each device chip from the adhesive tape (see Japanese Patent Laid-open No. 2002-334852, for example).

SUMMARY OF THE INVENTION

In the case that a plurality of rectangular devices are formed on the wafer so as to be separated by a plurality of division lines, the number of exposed portions of the adhesive tape between the rectangular devices in the direction where the shorter sides of the rectangular devices extend is larger than that in the direction where the longer sides of the rectangular devices extend. Accordingly, when the wafer is expanded uniformly both in the direction along the shorter sides and in the direction along the longer sides, the spacing between the adjacent devices in the direction along the shorter sides becomes smaller than the spacing between the adjacent devices in the direction along the longer sides, so that the spacing between the devices is not uniform.

This problem may also occur in the case of forming a modified layer inside the wafer along each division line and next applying an external force to the adhesive tape attached to the wafer, thereby dividing the wafer along each division line to obtain the individual device chips (see Japanese Patent Laid-open No. 2005-129607, for example).

It is therefore an object of the present invention to provide a wafer expanding method which can make uniform the spacing between the adjacent devices in the direction along the shorter sides and the spacing between the adjacent devices in the direction along the longer sides in expanding the adhesive tape attached to the wafer having the plural rectangular devices.

It is another object of the present invention to provide a wafer expanding apparatus for performing the wafer expanding method described above.

In accordance with an aspect of the present invention to provide a wafer expanding method for expanding a wafer having a plurality of rectangular devices respectively formed in a plurality of separate regions defined by a plurality of division lines, thereby increasing spacing between any adjacent ones of the devices, each of the rectangular devices having a pair of shorter sides and a pair of longer sides, the wafer expanding method including: a wafer preparing step of supporting the wafer through an adhesive tape to a ring frame having an inside opening accommodating the wafer in a condition where an annular exposed portion of the adhesive tape is defined between an outer circumference of the wafer and an inner circumference of the ring frame, the wafer being divided along each of the division lines or having division start points inside the wafer along each of the division lines; a jig preparing step of preparing an annular jig having a first restricting portion restricting a width of the annular exposed portion in a first direction where the shorter sides of the devices extend, a second restricting portion restricting a width of the annular exposed portion in a second direction where the longer sides of the devices extend, and a curved restricting portion formed so as to connect the first restricting portion and the second restricting portion; a fixing step of mounting the ring frame on a cylindrical frame fixing member, next mounting the annular jig on the ring frame, and next fixing the ring frame and the annular jig to the cylindrical frame fixing member; and an expanding step of operating a cylindrical pushing member having an outer circumference corresponding to the outer circumference of the wafer to push up the annular exposed portion of the adhesive tape and thereby lift the wafer away from the ring frame after performing the fixing step, thereby expanding the annular exposed portion and increasing the spacing between the adjacent devices, wherein when the wafer is lifted away from the ring frame by operating the cylindrical pushing member in the expanding step, the annular exposed portion in the first direction is first attached to the first restricting portion of the annular jig to thereby restrict the width of the annular exposed portion, and when the wafer is further lifted away from the ring frame, the annular exposed portion is next gradually attached to the curved restricting portion of the annular jig to thereby restrict the width of the annular exposed portion, and the annular exposed portion in the second direction is finally attached to the second restricting portion of the annular jig to thereby restrict the width of the annular exposed portion.

In accordance with another aspect of the present invention, there is provided a wafer expanding apparatus for expanding a wafer having a plurality of rectangular devices respectively formed in a plurality of separate regions defined by a plurality of division lines, thereby increasing spacing between any adjacent ones of the devices, each of the rectangular devices having a pair of shorter sides and a pair of longer sides, the wafer expanding apparatus including: a cylindrical frame fixing member; a cylindrical pushing member provided inside the cylindrical frame fixing member so as to be vertically movable relative to the cylindrical frame fixing member; a wafer unit including a ring frame supporting the wafer through an adhesive tape in a condition where an annular exposed portion of the adhesive tape is defined between an outer circumference of the wafer and an inner circumference of the ring frame, the ring frame having an inside opening accommodating the wafer, the ring frame being adapted to be mounted on the cylindrical frame fixing member, the wafer being divided along each of the division lines or having division start points inside the wafer along each of the division lines; an annular jig adapted to be mounted on the ring frame, the annular jig having a first restricting portion restricting a width of the annular exposed portion in a first direction where the shorter sides of the devices extend, a second restricting portion restricting a width of the annular exposed portion in a second direction where the longer sides of the devices extend, and a curved restricting portion formed so as to connect the first restricting portion and the second restricting portion, the annular exposed portion in the first direction being first attached to the first restricting portion by operating the cylindrical pushing member, the annular exposed portion in the second direction being finally attached to the second restricting portion by operating the cylindrical pushing member, the annular exposed portion between the first restricting portion and the second restricting portion being gradually attached to the curved restricting portion by operating the cylindrical pushing member to thereby restrict a width of the annular exposed portion between the first restricting portion and the second restricting portion; and fixing means fixing the ring frame and the annular jig to the cylindrical frame fixing member.

According to the wafer expanding method of the present invention, the fixing step is performed to fix the annular jig to the upper surface of the ring frame fixed to the cylindrical frame fixing member, in which the annular jig has the first restricting portion, the second restricting portion, and the curved restricting portion connecting the first restricting portion and the second restricting portion, so as to make the spacing between the rectangular devices uniform. Accordingly, the annular exposed portion of the adhesive tape in the first direction can be expanded more than the annular exposed portion in the second direction, in which a relatively large number of devices are arranged in the first direction and a relatively small number of devices are arranged in the second direction. Accordingly, the spacing between the adjacent devices in the first direction and the spacing between the adjacent devices in the second direction can be expanded uniformly.

According to the wafer expanding apparatus of the present invention, the annular jig is fixed to the upper surface of the ring frame fixed to the cylindrical frame fixing member, in which the annular jig has the first restricting portion, the second restricting portion, and the curved restricting portion connecting the first restricting portion and the second restricting portion, so as to make the spacing between the rectangular devices uniform. Accordingly, the annular exposed portion of the adhesive tape in the first direction can be expanded more than the annular exposed portion in the second direction, in which a relatively large number of devices are arranged in the first direction and a relatively small number of devices are arranged in the second direction. Accordingly, the spacing between the adjacent devices in the first direction and the spacing between the adjacent devices in the second direction can be expanded uniformly.

The above and other objects, features, and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a perspective view of a wafer expanding apparatus according to a preferred embodiment of the present invention;

FIG. 6A is a cross section similar to FIG. 5A, depicting an expanding step;

FIG. 6B is a cross section similar to FIG. 5B, depicting the expanding step.

DETAILED DESCRIPTION OF THE PREFERRED EMBODIMENT

Figure 1A:
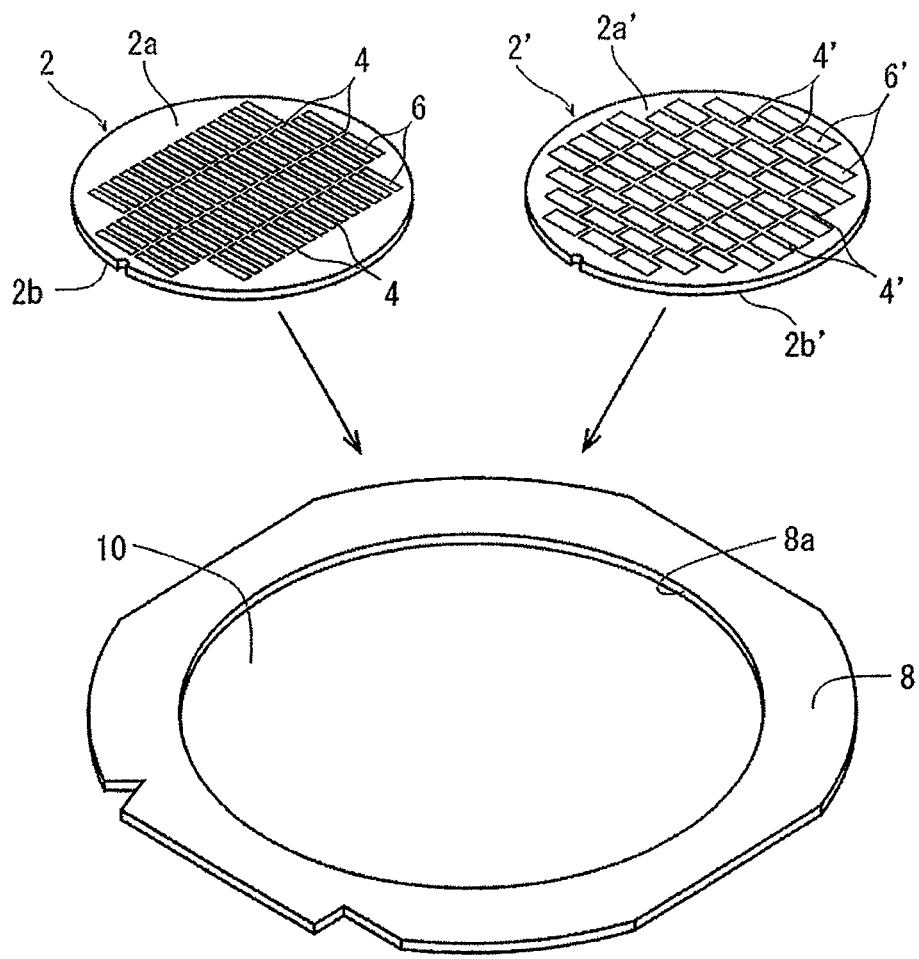
FIG. 1A is a perspective view depicting two kinds of wafers and a ring frame with an adhesive tape attached thereto.

A preferred embodiment of the wafer expanding method and the wafer expanding apparatus according to the present invention will now be described with reference to the drawings. In the wafer expanding method according to the present invention, a wafer preparing step is first performed to prepare a wafer supported through an adhesive tape to a ring frame having an inside opening for accommodating the wafer, the wafer being divided along a plurality of division lines or being formed with a division start point inside the wafer along each division line.

As the wafer to be prepared in the wafer preparing step, a wafer 2 or 2' depicted in FIG. 1 may be used. Both the wafer 2 and the wafer 2' are formed of a suitable semiconductor material such as silicon (Si), and have a circular shape. The wafer 2 has a front side 2a and a back side 2b. A plurality of crossing division lines 4 are formed on the front side 2a of the wafer 2 to thereby define a plurality of rectangular separate regions where a plurality of rectangular devices 6 such as ICs and LSIs are respectively formed. That is, the plural devices 6 are previously formed on the front side 2a of the wafer 2 so as to be separated by the division lines 4. On the other hand, the wafer 2' has a front side 2a' and a back side 2b'. A plurality of division lines 4' are formed on the front side 2a' of the wafer 2' to thereby define a plurality of rectangular separate regions where a plurality of rectangular devices 6' such as ICs and LSIs are respectively formed. That is, the plural devices 6' are previously formed on the front side 2a' of the wafer 2' so as to be separated by the division lines 4'. The division lines 4' are composed of a plurality of crossing division lines in one part and a plurality of zigzag division lines in the other part.

The wafer preparing step will now be described in more detail with reference to FIG. 1B. As depicted in FIG. 1B, a ring frame 8 having a circular inside opening 8a for accommodating the wafer 2 is used. A circular adhesive tape 10 is previously attached at its peripheral portion to the ring frame 8. That is, the circular inside opening 8a of the ring frame 8 is closed by the central portion of the adhesive tape 10. The back side 2b of the wafer 2 is attached to the adhesive tape 10 supported to the ring frame 8 in such a manner that the wafer 2 is located in the inside opening 8a of the ring frame 8. Thus, the wafer 2 is supported through the adhesive tape 10 to the ring frame 8, thereby forming a wafer unit 11. As a modification, the front side 2a of the wafer 2 may be attached to the adhesive tape 10. Thereafter, a dicing apparatus (not depicted) having a rotatable cutting blade is used to cut the wafer 2 along each division line 4, thereby dividing the wafer 2 along each division line 4. As another method, a laser processing apparatus (not depicted) for applying a laser beam may be used to perform ablation to the wafer 2 along each division line 4, thereby dividing the wafer 2 along each division line 4. In another case, a division start point such as a modified layer may be formed inside the wafer 2 along each division line 4 by using a laser processing apparatus to apply a laser beam to the wafer 2 along each division line 4, in which the strength of the wafer 2 can be reduced at this division start point and the wafer 2 can therefore be broken along each division line 4. As depicted in FIG. 1B, an annular exposed portion 10a of the adhesive tape 10 is defined between the outer circumference of the wafer 2 and the inner circumference of the ring frame 8. In FIG. 1B, a cut groove for dividing the wafer 2 along each division line 4 or the division start point formed inside the wafer 2 along each division line 4 is not depicted for convenience of illustration.

Figure 1B:
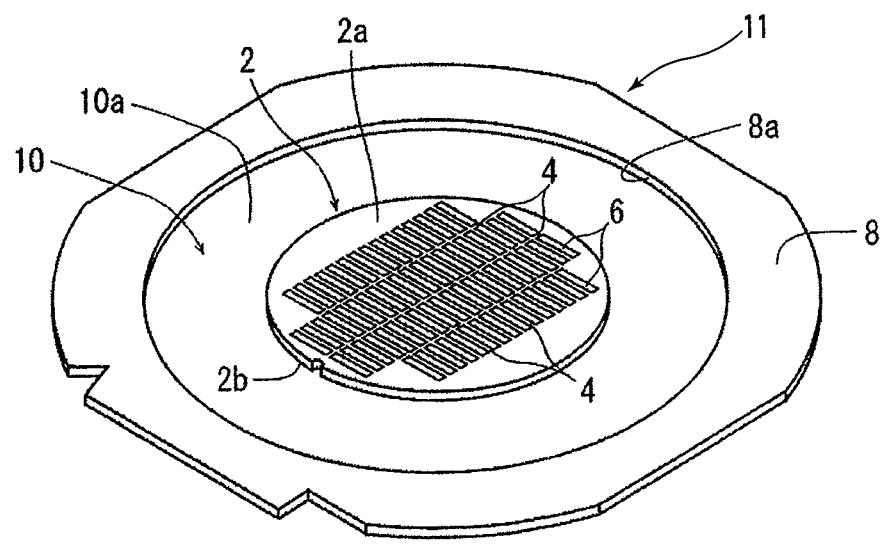
FIG. 1B is a perspective view depicting a wafer unit formed by supporting one of the wafers depicted in FIG. 1 through the adhesive tape to the ring frame.

In the case of using the wafer 2' having the devices 6' depicted in FIG. 1A, the wafer 2' is first attached to the adhesive tape 10 supported to the ring frame 8 in a similar manner. Thereafter, a laser processing apparatus is used to apply a laser beam along each division line 4', thereby dividing the wafer 2' along each division line 4' or forming a division start point inside the wafer 2' along each division line 4'.

In the following description, the wafer 2 supported through the adhesive tape 10 to the ring frame 8 is used to perform the wafer expanding method according to this preferred embodiment. After performing the wafer preparing step, a frame fixing step is performed to fix the ring frame 8 to a cylindrical frame fixing member having an upper end for mounting the ring frame 8. The frame fixing step may be performed by using a wafer expanding apparatus 12 (see FIG. 2) according to this preferred embodiment.

As depicted in FIG. 2, the wafer expanding apparatus 12 essentially includes a cylindrical frame fixing member 14 and a cylindrical pushing member 16. The cylindrical frame fixing member 14 functions to fix the ring frame 8 supporting the wafer 2 through the adhesive tape 10, the ring frame 8 having the inside opening 8a for accommodating the wafer 2, the wafer 2 having been already divided along each division line 4 or having been already formed with the division start point inside the wafer 2 along each division line 4. The cylindrical pushing member 16 has an outer circumference corresponding to the outer circumference of the wafer 2 and functions to push up the adhesive tape 10 to thereby lift the wafer 2 away from the ring frame 8 and expand the annular exposed portion 10a defined between the outer circumference of the wafer 2 and the inner circumference of the ring frame 8.

The outer diameter and the inner diameter of the cylindrical frame fixing member 14 correspond to the outer diameter and the inner diameter of the ring frame 8, respectively, so that the ring frame 8 can be mounted on the upper end of the cylindrical frame fixing member 14. More specifically, the outer diameter of the cylindrical frame fixing member 14 is equal to the outer diameter of the ring frame 8, and the inner diameter of the cylindrical frame fixing member 14 is equal to the inner diameter of the ring frame 8. A plurality of clamps 18 for fixing the ring frame 8 to the upper end of the cylindrical frame fixing member 14 are provided on the outer circumference of the cylindrical frame fixing member 14 so as to be arranged at given intervals in the circumferential direction of the cylindrical frame fixing member 14.

The cylindrical pushing member 16 is provided inside the cylindrical frame fixing member 14. The outer circumference of the cylindrical pushing member 16 corresponds to the outer circumference of the wafer 2. More specifically, the inner diameter of the cylindrical pushing member 16 is slightly larger than the diameter of the wafer 2. The cylindrical pushing member 16 is vertically movable relative to the cylindrical frame fixing member 14 by any suitable driving means such as an air cylinder and a motor-driven cylinder. When the driving means is operated to raise the cylindrical pushing member 16 relative to the cylindrical frame fixing member 14, the cylindrical pushing member 16 pushes up the adhesive tape 10 supporting the wafer 2 to thereby lift the wafer 2 away from the ring frame 8 fixed to the cylindrical frame fixing member 14, so that the annular exposed portion 10a of the adhesive tape 10 defined between the outer circumference of the wafer 2 and the inner circumference of the ring frame 8 is expanded by the upper end of the cylindrical pushing member 16. Although not depicted, a plurality of rollers are preferably provided on the upper end of the cylindrical pushing member 16 so as to be arranged annularly, thereby reducing a frictional resistance between the pushing member 16 and the adhesive tape 10, so that the expansion of the adhesive tape 10 attached to the wafer 2 can be promoted.

Figure 3A:
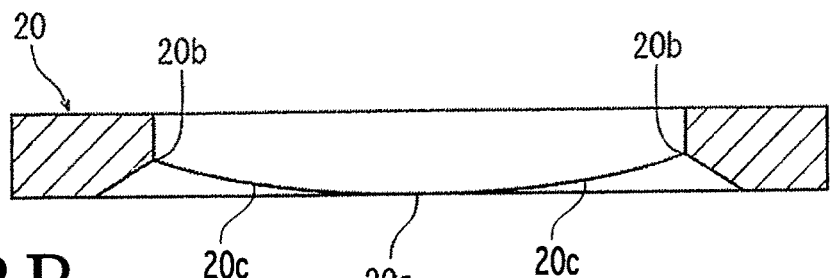
FIG. 3A is a cross section taken along the line A-A in FIG. 2.
Figure 3B:
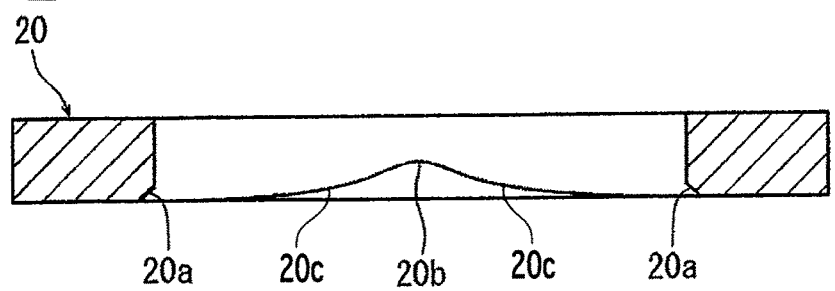
FIG. 3B is a cross section taken along the line B-B in FIG. 2.

Referring to FIG. 2 and FIGS. 3A and 3B, the wafer expanding apparatus 12 further includes an annular jig 20 adapted to be provided on the upper surface of the ring frame 8 mounted on the upper end of the cylindrical frame fixing member 14. The annular jig 20 functions to make the spacing between the rectangular devices 6 uniform. The jig 20 has a pair of first restricting portions 20a diametrically opposed to each other and a pair of second restricting portions 20b diametrically opposed to each other so as to be 90° C. shifted from the first restricting portions 20a. The first restricting portions 20a function to restrict the width of the annular exposed portion 10a of the adhesive tape 10 in such a manner that when the cylindrical pushing member 16 is raised to push up the adhesive tape 10 and lift the wafer 2 away from the ring frame 8, the annular exposed portion 10a in the direction where the shorter sides of the rectangular devices 6 extend is first attached to the first restricting portions 20a. The second restricting portions 20b function to restrict the width of the annular exposed portion 10a of the adhesive tape 10 in such a manner that when the wafer 2 is further lifted away from the ring frame 8, the annular exposed portion 10a in the direction where the longer sides of the rectangular devices 6 extend is finally attached to the second restricting portions 20b.

As depicted in FIGS. 3A and 3B, the pair of first restricting portions 20a are formed on the lower end of the inner circumference of the jig 20 at diametrically opposite positions, and the pair of second restricting portions 20b are formed on the lower end of the inner circumference of the jig 20 at diametrically opposite positions in such a manner that each second restricting portion 20b is interposed between the pair of first restricting portions 20a. More specifically, the first restricting portion 20a and the second restricting portion 20b adjacent to each other are positioned 90° C. apart from each other about the center of the jig 20. Further, as apparent from FIGS. 3A and 3B, the vertical position of each first restricting portion 20a is the same as that of the lower end of the jig 20, and the vertical position of each second restricting portion 20b is higher than that of the lower end of the jig 20. The lower end of the inner circumference of the jig 20 is curved between the first restricting portion 20a and the second restricting portion 20b adjacent to each other. That is, the first restricting portion 20a and the second restricting portion 20b adjacent to each other are connected by a curved restricting portion 20c.

Figure 4:
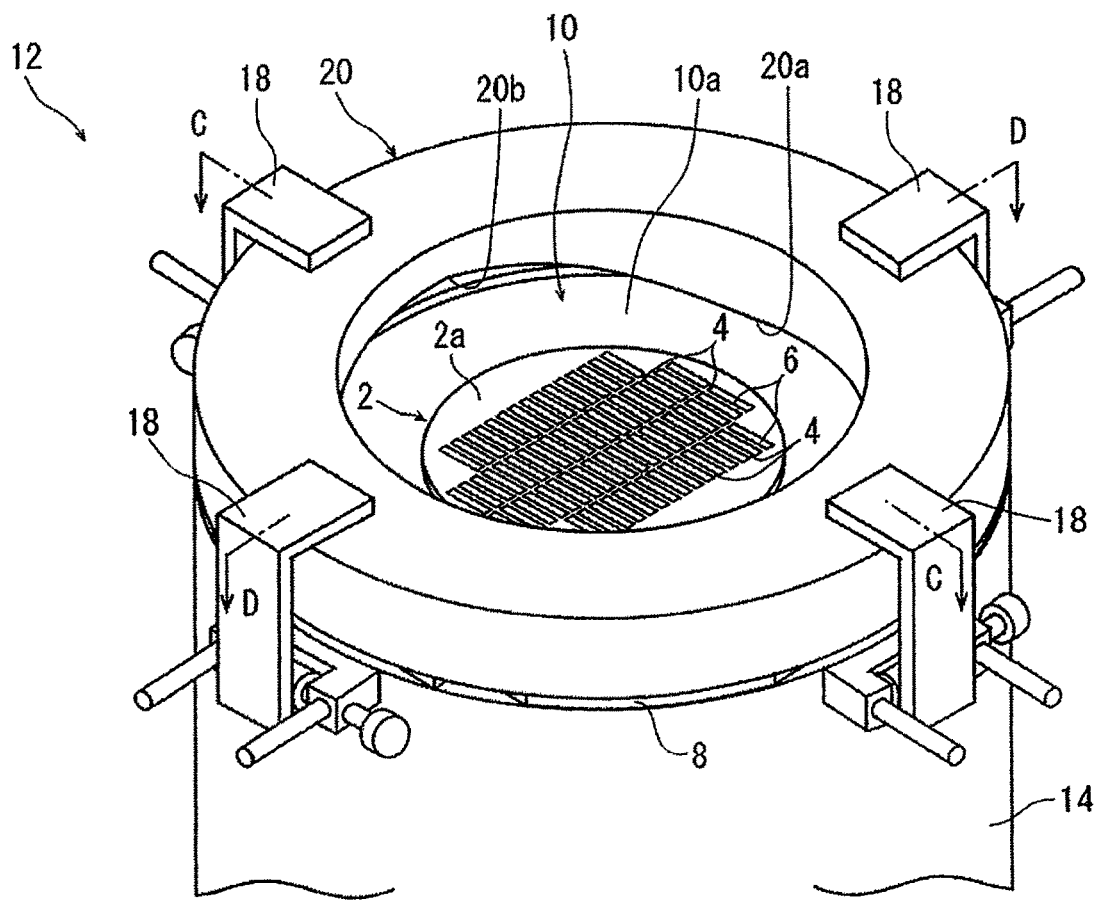
FIG. 4 is a perspective view depicting a frame fixing step using the wafer expanding apparatus depicted in FIG. 2.

The frame fixing step will now be described in more detail with reference to FIG. 4. In the frame fixing step, the ring frame 8 supporting the wafer 2 through the adhesive tape 10 is first mounted on the upper end of the cylindrical frame fixing member 14. Thereafter, the annular jig 20 is mounted on the upper surface of the ring frame 8 in the condition where the first restricting portions 20a and the second restricting portions 20b of the jig 20 are oriented downward. At this time, as depicted in FIG. 4, the positional relation between the wafer 2 and the jig 20 is adjusted so that the line segment connecting the two opposite first restricting portions 20a becomes parallel to the direction where the shorter sides of the rectangular devices 6 extend (this direction will be hereinafter referred to as first direction) and that the line segment connecting the two opposite second restricting portions 20b becomes parallel to the direction where the longer sides of the rectangular devices 6 extend (this direction will be hereinafter referred to as second direction). Thereafter, the plural clamps 18 of the cylindrical frame fixing member 14 are operated to press the upper end of the jig 20, thereby fixing the jig 20 and the ring frame 8 to the upper end of the cylindrical frame fixing member 14 as depicted in FIG. 4.

After performing the frame fixing step, an expanding step is performed to push up the adhesive tape 10 attached to the wafer 2 by raising the cylindrical pushing member 16 having an outer circumference slightly larger in size than the outer circumference of the wafer 2, thereby lifting the wafer 2 away from the ring frame 8 and expanding the annular exposed portion 10a of the adhesive tape 10 defined between the outer circumference of the wafer 2 and the inner circumference of the ring frame 8, so that the spacing between any adjacent ones of the devices 6 is increased.

Figure 5A:
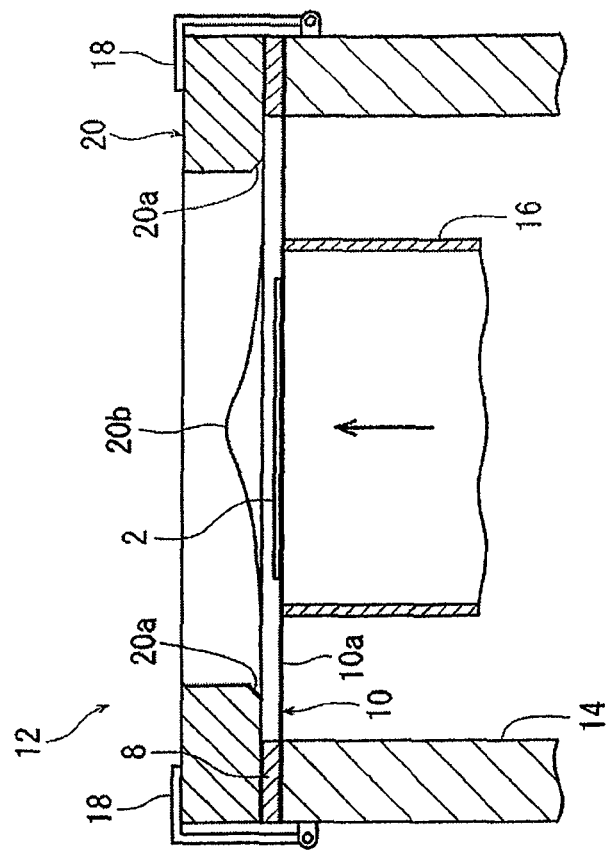
FIG. 5A is a cross section taken along the line C-C in FIG. 4.
Figure 5B:
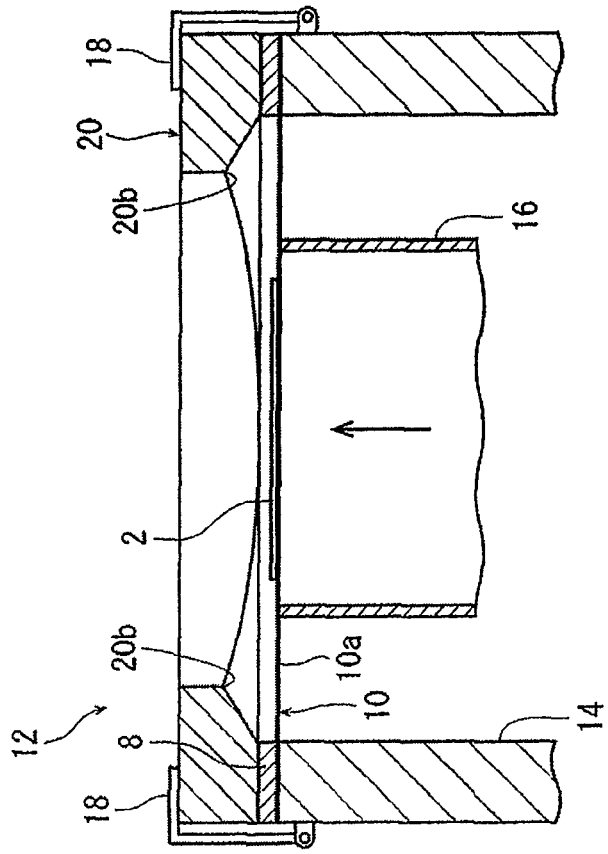
FIG. 5B is a cross section taken along the line D-D in FIG. 4.

The expanding step will now be described in more detail with reference to FIGS. 5A to 6B. FIGS. 5A and 5B depict an initial position of the cylindrical pushing member 16 before starting the expanding step. In this initial position, the upper end of the cylindrical pushing member 16 is at substantially the same level as that of the upper end of the cylindrical frame fixing member 14. In the expanding step, the cylindrical pushing member 16 is raised from this initial position relative to the cylindrical frame fixing member 14 by operating the driving means. Accordingly, the annular exposed portion 10a of the adhesive tape 10 is pushed up by the upper end of the cylindrical pushing member 16, and the wafer 2 supported through the adhesive tape 10 to the ring frame 8 is accordingly lifted away from the ring frame 8 fixed to the cylindrical frame fixing member 14. As a result, the annular exposed portion 10a defined between the outer circumference of the wafer 2 and the inner circumference of the ring frame 8 is expanded. As depicted in FIGS. 5A and 5B, the inner diameter of the cylindrical pushing member 16 is slightly larger than the diameter of the wafer 2 before performing the expanding step.

When the wafer 2 is lifted away from the ring frame 8 by operating the cylindrical pushing member 16 as described above, the annular exposed portion 10a in the first direction of the devices 6 is first attached to the first restricting portions 20a of the jig 20, so that the width of the annular exposed portion 10a in the first direction of the devices 6 is restricted by the first restricting portions 20a. Thereafter, when the wafer 2 is further lifted away from the ring frame 8 by raising the cylindrical pushing member 16, the annular exposed portion 10a is next gradually attached to the curved restricting portions 20c of the jig 20. Finally, the annular exposed portion 10a in the second direction of the devices 6 is attached to the second restricting portions 20b of the jig 20, so that the width of the annular exposed portion 10a is restricted by the second restricting portions 20b.

Figure 7:
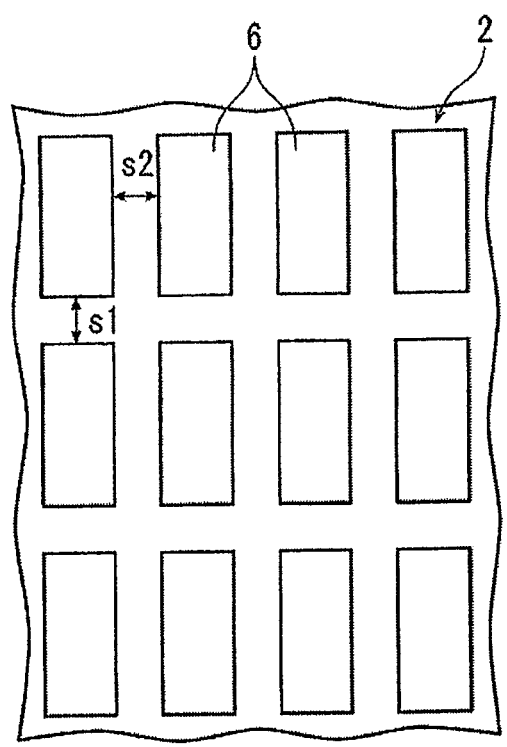
FIG. 7 is a plan view of an essential part of the wafer expanded in the expanding step, depicting the condition where the spacing between the adjacent devices in the first direction and the spacing between the adjacent devices in the second direction are made equal to each other.

In this manner, the width of the annular exposed portion 10a in the first direction of the rectangular devices 6 and the width of the annular exposed portion 10a in the second direction of the rectangular devices 6 are stepwise restricted, in which a relatively large number of devices 6 are arranged in the first direction and a relatively small number of devices 6 are arranged in the second direction. Accordingly, the annular exposed portion 10a in the first direction of the devices 6 as first restricted by the first restricting portions 20a of the jig 20 can be expanded more than the annular exposed portion 10a in the second direction of the devices 6 as finally restricted by the second restricting portions 20b of the jig 20. As a result, the amount of expansion of the wafer 2 in the first direction of the devices 6 becomes larger than the amount of expansion of the wafer 2 in the second direction of the devices 6 as depicted in FIGS. 6A and 6B. That is, after expansion of the wafer 2, the length L1 of the wafer 2 in the first direction of the devices 6 becomes larger than the length L2 of the wafer 2 in the second direction of the devices 6. In other words, the shape of the wafer 2 after expansion becomes elliptical in such a manner that the major axis is parallel to the first direction and the minor axis is parallel to the second direction. Further, the expansion of the adhesive tape 10 attached to each device 6 is suppressed as compared with the expansion of the adhesive tape 10 exposed between the devices 6. Accordingly, as depicted in FIG. 7, the spacing S1 between the devices 6 in the first direction and the spacing S2 between the devices 6 in the second direction can be made equal to each other after expansion of the wafer 2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer expanding method for expanding a wafer having a plurality of rectangular devices respectively formed in a plurality of separate regions defined by a plurality of division lines, thereby increasing spacing between any adjacent ones of the devices, each of the rectangular devices having a pair of shorter sides and a pair of longer sides, the wafer expanding method comprising:

a wafer preparing step of supporting the wafer through an adhesive tape to a ring frame having an inside opening accommodating the wafer in a condition where an annular exposed portion of the adhesive tape is defined between an outer circumference of the wafer and an inner circumference of the ring frame, the wafer being divided along each of the division lines or having division start points inside the wafer along each of the division lines;

a jig preparing step of preparing an annular jig having a first restricting portion restricting a width of the annular exposed portion in a first direction where the shorter sides of the devices extend, a second restricting portion restricting a width of the annular exposed portion in a second direction where the longer sides of the devices extend, and a curved restricting portion formed so as to connect the first restricting portion and the second restricting portion;

a fixing step of mounting the ring frame on a cylindrical frame fixing member, next mounting the annular jig on the ring frame, and next fixing the ring frame and the annular jig to the cylindrical frame fixing member; and an expanding step of operating a cylindrical pushing member having an outer circumference corresponding to the outer circumference of the wafer to push up the annular exposed portion of the adhesive tape and thereby lift the wafer away from the ring frame after performing the fixing step, thereby expanding the annular exposed portion and increasing the spacing between the adjacent devices, wherein when the wafer is lifted away from the ring frame by operating the cylindrical pushing member in the expanding step, the annular exposed portion in the first direction is first attached to the first restricting portion of the annular jig to thereby restrict the width of the annular exposed portion, and when the wafer is further lifted away from the ring frame, the annular exposed portion is next gradually attached to the curved restricting portion of the annular jig to thereby restrict the width of the annular exposed portion, and the annular exposed portion in the second direction is finally attached to the second restricting portion of the annular jig to thereby restrict the width of the annular exposed portion.

2. A wafer expanding apparatus for expanding a wafer having a plurality of rectangular devices respectively formed in a plurality of separate regions defined by a plurality of division lines, thereby increasing spacing between any adjacent ones of the devices, each of the rectangular devices having a pair of shorter sides and a pair of longer sides, the wafer expanding apparatus comprising:

a cylindrical frame fixing member;

a cylindrical pushing member provided inside the cylindrical frame fixing member so as to be vertically movable relative to the cylindrical frame fixing member;

a wafer unit including a ring frame supporting the wafer through an adhesive tape in a condition where an annular exposed portion of the adhesive tape is defined between an outer circumference of the wafer and an inner circumference of the ring frame, the ring frame having an inside opening accommodating the wafer, the ring frame being adapted to be mounted on the cylindrical frame fixing member, the wafer being divided along each of the division lines or having division start points inside the wafer along each of the division lines;

an annular jig adapted to be mounted on the ring frame, the annular jig having a first restricting portion restricting a width of the annular exposed portion in a first direction where the shorter sides of the devices extend, a second restricting portion restricting a width of the annular exposed portion in a second direction where the longer sides of the devices extend, and a curved restricting portion formed so as to connect the first restricting portion and the second restricting portion, the annular exposed portion in the first direction being first attached to the first restricting portion by operating the cylindrical pushing member, the annular exposed portion in the second direction being finally attached to the second restricting portion by operating the cylindrical pushing member, the annular exposed portion between the first restricting portion and the second restricting portion being gradually attached to the curved restricting portion by operating the cylindrical pushing member to thereby restrict a width of the annular exposed portion between the first restricting portion and the second restricting portion; and fixing means fixing the ring frame and the annular jig to the cylindrical frame fixing member.

* * * * *